United States Patent
Nagaoki et al.

(10) Patent No.: US 8,426,811 B2
(45) Date of Patent: Apr. 23, 2013

(54) ELECTRON MICROSCOPE

(75) Inventors: Isao Nagaoki, Hitachinaka (JP); Toshiaki Tanigaki, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 68 days.

(21) Appl. No.: 13/059,550

(22) PCT Filed: Jul. 10, 2009

(86) PCT No.: PCT/JP2009/062928
§ 371 (c)(1),
(2), (4) Date: Feb. 17, 2011

(87) PCT Pub. No.: WO2010/038534
PCT Pub. Date: Apr. 8, 2010

(65) Prior Publication Data
US 2011/0133084 A1    Jun. 9, 2011

(30) Foreign Application Priority Data
Sep. 30, 2008    (JP) ................. 2008-252130

(51) Int. Cl.
*G01N 23/00* (2006.01)
*G21K 7/00* (2006.01)

(52) U.S. Cl.
USPC ........... 250/310; 250/305; 250/306; 250/307; 250/308; 250/309; 250/311; 250/398; 250/442.11

(58) Field of Classification Search .......... 250/305–311, 250/398, 442.11
See application file for complete search history.

(56) References Cited

U.S. PATENT DOCUMENTS

| | | | |
|---|---|---|---|
| 3,569,698 A * | 3/1971 | Herrman ...................... 250/398 |
| 5,432,347 A | 7/1995 | Coene |
| 5,814,815 A | 9/1998 | Matsumoto et al. |
| 6,836,373 B2 | 12/2004 | Hosokawa |
| 2002/0011566 A1* | 1/2002 | Nagayama et al. ........... 250/311 |
| 2003/0029999 A1 | 2/2003 | Hosokawa |
| 2003/0066964 A1 | 4/2003 | Nagayama |
| 2006/0237646 A1* | 10/2006 | Watanabe et al. ............. 250/310 |
| 2008/0099677 A1 | 5/2008 | Yoshida |
| 2008/0202918 A1 | 8/2008 | Nagayama et al. |

FOREIGN PATENT DOCUMENTS

| | | |
|---|---|---|
| JP | 7-73838 | 3/1995 |
| JP | 9-237603 | 9/1997 |
| JP | 2002-134057 | 5/2002 |

(Continued)

OTHER PUBLICATIONS

European Search Report issued in European Patent Application No. 09817571.4 dated Mar. 22, 2012.

*Primary Examiner* — Jack Berman
*Assistant Examiner* — Meenakshi Sahu
(74) *Attorney, Agent, or Firm* — McDermott Will & Emery LLP

(57) ABSTRACT

An electron microscope according to the present invention includes a phase plate (510) having a thickness which changes in a radial direction, and adjusts a phase difference caused by a difference in electron beam path due to an effect of a spherical aberration when an electron beam is converged by a lens or an image of the electron beam is formed. Accordingly, the phase difference caused by the difference in electron beam path is adjusted, to thereby improve the coherence, so that a phase contrast image of transmitted electrons can be obtained at a higher resolution.

11 Claims, 13 Drawing Sheets

FOREIGN PATENT DOCUMENTS

| | | |
|---|---|---|
| JP | 2006-012795 | 1/2006 |
| JP | 2006-162805 | 6/2006 |
| JP | 2006-318939 | 11/2006 |
| JP | 2006-339051 | 12/2006 |
| JP | 2008-112643 | 5/2008 |

* cited by examiner (a)

(b)

(a)

(b)

(a)

(b)

(a)

(b)

(a)

(b)

ELECTRON MICROSCOPE

RELATED APPLICATIONS

This application is the U.S. National Phase under 35 U.S.C. §371 of International Application No. PCT/JP2009/062928, filed on Jul. 10, 2009, which in turn claims the benefit of Japanese Application No. 2008-252130, filed on Sep. 30, 2008, the disclosures of which Applications are incorporated by reference herein.

TECHNICAL FIELD

The present invention relates to an electron microscope. For example, the present invention relates to a phase adjuster for providing an arbitrary phase adjusting mechanism in terms of electron beam optics. In addition, for example, the present invention relates to a spherical aberration of the electron microscope. In addition, for example, the present invention relates to a transmission electron microscope for forming an enlarged image of a sample to be observed as faithfully to its original structure as possible.

BACKGROUND ART

A transmission electron microscope is an apparatus which enables the observation of an atomic-scale structure, and fulfills its function in various fields. However, an image which can be observed using the transmission electron microscope is an image formed by the interference between electron beams, and hence the observed image cannot be interpreted as it is. Therefore, simulation and the like are performed, and observation results and calculation results are compared with each other, to thereby analyze the original structure of an observation sample.

JP Patent Publication (Kokai) No. 2006-162805 A discloses a phase difference electron microscope.

In addition, JP Patent Publication (Kokai) No. 2006-318939 A discloses a spherical aberration corrector.

CITATION LIST

Patent Literatures

Patent Literature 1: JP Patent Publication (Kokai) No. 2006-162805 A
Patent Literature 2: JP Patent Publication (Kokai) No. 2006-318939 A

Non Patent Literature

Non Patent Literature 1: R. Danev and K. Nagayama, Ultramicroscopy, 88 (2001) 243.

SUMMARY OF INVENTION

Technical Problem

The inventors of the present application intensively studied the reason why results observed using a transmission electron microscope are different from the original structure of a sample. As a result, the following findings were obtained.

Hereinafter, the reason why the results observed using the transmission electron microscope are different from the original structure of the sample is described by describing the principle of image formation by the transmission electron microscope.

An image observed using the transmission electron microscope is formed by the contrast between light and dark. The contrast observed using the transmission electron microscope is roughly categorized into a scattering contrast and a phase contrast.

For the scattering contrast, electrons scattered by the sample are cut for image formation by an objective diaphragm which is disposed on the back focal plane of an objective lens and transmits therethrough only a transmission wave, whereby an image is obtained. The scattering contrast refers to a contrast obtained by scattering as its name suggests.

On the other hand, the phase contrast refers to a contrast obtained by the interference between electron beams. In a broader interpretation, the phase contrast refers to a contrast generated by the interference between all the electron waves which contribute to the image formation by using an appropriate objective diaphragm, of electron waves generated on the lower surface of the sample.

Here, it is assumed that an electron wave which has a wavelength of $\lambda$ and is accelerated at a voltage of E is 1, and an image is formed by a transmission wave $\psi(r)$ which has been transmitted through a sample having a potential of $\phi(r)$ which is weak in scattering intensity. Then, the formed image as described above is discussed. The transmission wave $\psi(r)$ can be expressed as follows.

$$\psi(r)=\exp(-i\sigma\phi)=\cos\sigma\phi - i\sin\sigma\phi \tag{1}$$

where $\sigma=\pi/\lambda E$ and $\phi=\phi(r)\cdot\Delta Z$. Here, if $\sigma\phi$ is sufficiently smaller than $\pi/2$, the following approximation is possible.

$$\psi(r)=1-i\sigma\phi \tag{2}$$

The electron microscope image is observed as the intensity of a wave function obtained by further subjecting an electron beam diffraction wave which is a Fourier transform of the above-mentioned transmission wave, to the Fourier transform by means of a lens action.

The wave function of the electron beam diffraction image is a Fourier transform of Expression (2), and thus is expressed as follows.

$$Q(g)=\delta - i\sigma\Phi(g) \tag{3}$$

where $\delta$ is a Dirac $\delta$ function and represents a transmitted non-scattering wave, $\Phi(g)$ is a Fourier transform of $\phi$ and represents a scattering wave on a diffraction image plane, and g corresponds to 1/r.

A phase difference of $\gamma(g)$ is generated in the scattering wave due to influences of the spherical aberration of a lens or focus. When this phase difference is taken into consideration, $\exp-i\gamma(g)$ is applied to Expression (3), so that the following expression is obtained.

$$Q(g)=\delta - \sigma\Phi(g)\sin\gamma(g) - i\sigma\Phi(g)\cos\gamma(g) \tag{4}$$

A wave function on the image plane is a Fourier transform image of Expression (4), and when F is assumed as a sign representing the Fourier transform, the following expression is obtained.

$$\psi(r)=1-\sigma F\{\Phi(g)\sin\gamma(g)\} - i\sigma F\{\Phi(g)\cos\gamma(g)\} \tag{5}$$

An observed intensity I(r) is $\psi(r)\ \psi(r)^*$, and hence when the second-order term of $\sigma\phi$ is omitted, the following expression is obtained.

$$I(r) \cong 1 - 2\sigma F\{\Phi(g)\sin\gamma(g)\} \quad (6)$$
$$= 1 - 2\sigma \int \Phi(g)\sin\gamma(g)\exp(-ig\cdot r)\cdot dg$$

Here, $\int\Phi(g)\exp(-ig\cdot r)\cdot dg$ is a Fourier transform of the diffraction image, and is $\psi(-r)$ on the lower surface of the sample. Accordingly, the following expression is obtained.

$$I(r) = 1 - 2\sigma\psi(-r)*F\sin\gamma(g) \quad (7)$$

where * represents a convolution operation defined by f(x)*h(x)=∫f(x)h(x−X)dX. In order to maximize the observed intensity, it is necessary to change γ(g) by a given measure to make sin γ(g)−1 or +1. At this time, the following expression is obtained.

$$I(r) = 1 \pm 2\sigma\psi(-r) \quad (8)$$

An amount of change in the intensity of the observed image is proportional to an electrostatic potential of an object projected in an entering electron beam direction. A function sin γ(g) which transmits phase information which contributes to the contrast to the image is referred to as a phase contrast transmitting function (phase CTF).

However, in actuality, it is difficult to manufacture a transmission electron microscope in which sin γ(g) is constantly kept −1 or +1. In a conventional transmission electron microscope (CTEM), it was merely possible to make sin γ(g) −1 or +1 only for part of g.

This is because focus, the spherical aberration of a lens, a beam divergence, and the deviation from an in-focus position due to a chromatic aberration affect the CTF. For example, in an electron microscope with an accelerating voltage of 300 kV, when the defocus is 48 nm, the spherical aberration is 0.9 mm, the deviation from the in-focus position due to the chromatic aberration is 5 nm, and the beam divergence is 0.3 mrad, the CTF is as shown in FIG. 1. The horizontal axis thereof is g in units of 1/nm.

In a region surrounded by a dotted line in FIG. 1, sin γ(g) exhibits a value close to −1, and hence diffraction information (Fourier transform components) contained in this region contributes to an image formed by the transmission electron microscope, at a relatively high intensity. As this region is broader, the formed image shows information which is more faithful to the original information of a sample. Therefore, the design of the electron microscope and focusing at the time of photographing are performed so that this region becomes broader. The focus which allows as much diffraction information as possible to contribute to the image formation is referred to as Sherzer focus, which is named after the name of the proposer thereof.

In the case where photographing is performed under the above-mentioned conditions by using a normal transmission electron microscope, almost no diffraction information outside of the region indicated by the dotted line in FIG. 1 can be reflected to the electron microscope image. In order to form an image of the diffraction information outside of this region, it is necessary to change the focus and change the shape of the CTF, to thereby cause sin γ(g) to exhibit a value close to −1 or +1 at g at which the necessary diffraction information exists. However, even in that case, there are some pieces of diffraction information which do not contribute to the image formation.

An influence of this loss of the diffraction information on the formed electron microscope image is described by using: Fourier transform images which are simple pictures; and images which are reproduced by applying modulation to the Fourier transform image, removing part of the diffraction information therefrom, and then subjecting the image to the inverse Fourier transform. The first Fourier transform corresponds to the electron beam diffraction image in the transmission electron microscope, the application of modulation corresponds to the addition of the CTF inherent to the electron microscope, and the calculation of the inverse Fourier transform image thereof corresponds to the image formation in the transmission electron microscope.

First, the original space information is illustrated in FIG. 2(a). This is a picture which is obtained by superimposing an image having a regular structure similar to a crystal structure onto a picture of a waterfall at the upper left part of the figure. The following description is given on the assumption that a portion indicated by a dark contrast in the picture corresponds to a portion having a higher potential within the sample observed by the transmission electron microscope.

The Fourier transform image of FIG. 2(a) is illustrated in FIG. 2(b). The image has an appearance totally different from its original image. This Fourier transform image corresponds to an electron beam diffraction image in the case of the transmission electron microscope. Spots which indicate the Fourier transform of the regular structure superimposed onto the image are observed in FIG. 2(b). In addition, a point at the center thereof corresponds to a transmission wave in the transmission electron microscope, and the Fourier transform image of the waterfall appearing in the picture is observed in the vicinity thereof, though at a low intensity.

Here, the case where components outside of FIG. 2(b) do not contribute to the image formation by CTF modulation of the transmission electron microscope is discussed. The Fourier transform image after the CTF modulation which is assumed in this case is illustrated in FIG. 2(c). To simplify phenomenon, it is assumed that the CTF exhibits 1 when g is from 0 to $g_C$ and exhibits 0 when g is equal to or larger than $g_C$. The assumed CTF is illustrated in FIG. 2(b). When the CTF modulation is applied to the Fourier transform image, it was assumed that all pieces of information located at the same radius g with respect to the center of the Fourier transform image are subjected to the modulation of CTF (g). In the case of the transmission electron microscope, this assumption corresponds to the state where there is not any astigmatism. FIG. 2(c) is the same as FIG. 2(b) near the center, whereas, in FIG. 2(c), the CTF exhibits 0 in the region having a radius equal to or larger than $g_C$.

The Fourier transform image of FIG. 2(c) is illustrated in FIG. 2(d). This operation is equivalent to the image formation in the transmission electron microscope. In FIG. 2(d), although the original picture is roughly reflected, detailed information on splashes of the waterfall and the like has been lost. Such lost space information d is space information smaller than $1/g_C$ which is an inverse of $g_C$ which is given when the modulation is applied to the Fourier transform. For example, some diffraction waves $g_{crystal}$ which are obtained by the Fourier transform of the regular structure at the upper left part of FIG. 2(a) appear in regions surrounded by a circle in FIG. 2(b). The diffraction waves $g_{crystal}$ which appear in FIG. 2(b) are cut by performing the CTF modulation, with the result that information on the diffraction waves is lost in FIG. 2(c). As a result of subjecting FIG. 2(c) to the Fourier transform to form an image, the regular (crystal) structure which originally exists at the upper left part of FIG. 2(a) is lost in the formed image of FIG. 2(d).

On the other hand, it is assumed that CTF modulation is applied to FIG. 2(b), to thereby form an image of diffraction information as illustrated in FIG. 2(e). In this CTF modulation, the CTF exhibits 0 in a region having a radius equal to or smaller than $g_{C1}$ near the center and a region having a radius equal to or larger than $g_{C2}$.

The Fourier transform image of FIG. 2(e) is illustrated in FIG. 2(f). The information on the diffraction waves $g_{crystal}$ is left in FIG. 2(e), and hence the regular (crystal) structure which originally exists at the upper left part of FIG. 2(a) is reproduced. However, it can be understood that the contrasts of the waterfall and a shore are remarkably reduced. This lost information is a structure which is larger than $d_{C1}=1/g_{C1}$. In this way, as a result of applying the CTF modulation to the Fourier transform, part of the diffraction information does not contribute to the image formation, which leads to a problem that the original structure of the sample is not reflected in the image formed by this Fourier transform.

Accordingly, ideally, the CTF required for the transmission electron microscope always exhibits −1 or +1. However, in actuality, as described above, it is difficult to design the transmission electron microscope so that the CTF always exhibits −1 or +1.

In the transmission electron microscope, as described above, the CTF has an undulate form as shown in FIG. 1 which is decided by the spherical aberration of the objective lens, the focus at the time of photographing, the beam divergence, and the chromatic aberration. Because the required space information r is different depending on a structure to be observed, the focus and the spherical aberration need to be changed. On this occasion, the spherical aberration of the objective lens is an inherent value affected by a gap of the designed objective lens, and hence fine adjustment is performed by the focus. In addition, the transmission electron microscope has a mechanism in which a sample is inserted into the gap of the objective lens. Therefore, there is a physical limit to the reduction in the gap thereof, and there is a limit to the design of the objective lens. Therefore, the CTF in the transmission electron microscope is subjected to various restrictions, and thus can exhibit a value close to −1 or +1 only within a limited range, with the result that the resolution is restricted.

In recent years, it has been required to perform photographing while variously changing elements which affect the CTF, and a spherical aberration correcting apparatus capable of changing the spherical aberration, which was a value inherent to an objective lens conventionally, has been developed.

The CTF under the following conditions is as shown in FIG. 3. That is, the spherical aberration is corrected to 0.005 mm by using this spherical aberration correcting apparatus, the accelerating voltage is 300 kV, the defocus is 4.5 nm, the deviation from the in-focus position due to the chromatic aberration is 3 nm, and the beam divergence is 0.3 mrad.

In the CTF shown in FIG. 3, an S region in which $\sin(\gamma)$ exhibits −1 is broader than that in the CTF shown in FIG. 1, and $\sin(\gamma)$ exhibits a value up to a portion in which g is approximately 10. From this fact, it is understood that a resolution equal to or smaller than 0.1 nm can be achieved theoretically by using this spherical aberration correcting apparatus.

With regard to the case where a normal crystal structure is observed, it can be said that the resolution of the electron microscope has reached a sufficient level, partly because of the development of the spherical aberration correcting apparatus. However, on the other hand, information on an L region in FIG. 3 has been lost. Hereinafter, this problem is described.

In consideration of the relation between the CTF and the TEM image which is described with reference to FIG. 2, the loss of the L region in the CTF in FIG. 3 corresponds to the loss of information on a large structure. In an actual TEM sample, this large information is, for example, information in which the contrast of a cell organelle in an embedding resin and the like are contained in this region.

In the observation using a conventional biological TEM, a sample is stained, and a small objective diaphragm is used, to thereby obtain the contrast of the cell organelle. However, when the objective diaphragm is made smaller, there arises a side effect that the resolution of a TEM image becomes lower. Therefore, it has been necessary to gropingly find out conditions for the best observation, in view of the relation between the contrast and the size of a structure to be observed.

A method which has attracted attention in recent years as a solution to this problem is a phase difference transmission electron microscope method. This method is a method of using a thin film with a small hole as an objective diaphragm, and has a feature that a diffraction wave other than a transmission wave is transmitted through the thin film part and a phase difference of $\pi/2$ is given to the diffraction wave at this time.

For example, in the case where an objective diaphragm which gives a phase difference of $\pi/2$ to a diffraction wave having g=0.5 or larger is used in a TEM, the CTF is as shown in FIG. 4. In this TEM, the spherical aberration is corrected to 0.005 mm by using the spherical aberration correcting apparatus, the accelerating voltage is 300 kV, the defocus is 4.5 nm, the deviation from the in-focus position due to the chromatic aberration is 3 nm, and the beam divergence is 0.3 mrad.

From the CTF shown in FIG. 4, it is understood that a value of $\sin(\gamma)$ exhibits −1 from the beginning by using a phase plate. This is the very effect which is obtained by using the phase plate to thereby shift the phase of the diffraction wave by $\pi/2$ in a region having g=0.5 or larger, and a previous CTEM does not have such a feature. There has been known that this effect enables observation even when the structure of a cell organelle is not stained, in a phase TEM (hereinafter, abbreviated to PTEM) using a phase plate with a further smaller hole. (R. Danev and K. Nagayama, Ultramicroscopy, 88 (2001) 243.

It is understood that, according to the above-mentioned method, $\sin(\gamma)$ exhibits 0 near g=7.8 at the time of the observation using the PTEM in which a phase plate is used in a spherical aberration correcting apparatus capable of obtaining information of 0.1 nm. In this condition, part of information is lost, and hence it is not possible to obtain all information that the sample originally has.

An object of the present invention relates to providing a CTF in which $|\sin(\gamma)|$ is constantly kept +1 for all values of g.

In addition, an object of the present invention relates to adjusting a phase difference in an apparatus using an electron beam and thus improving the coherence thereof. This is because, when an electron beam is to be converged by a lens or an image of an electron microscope using the lens is to be formed, an influence of a spherical aberration causes a phase difference of the electron beam and thus prevents an interference effect from being sufficiently obtained.

Solution to Problem

The present invention relates to adjusting a phase difference due to a difference in electron beam path which is caused when the electron beam is converged by a lens or an image of the electron beam is formed, and eliminating the difference. Specifically, for example, a phase plate having a thickness which changes from its center in the radial direction is used, and a thickness effect, a potential effect, or these two effects are used to thereby adjust a phase of the electron beam. In addition, for example, the present invention is realized by a potential adjusting function, a temperature adjusting function, a phase plate atmosphere gas pressure adjusting mechanism, a phase plate astigmatism correcting mechanism, a phase plate tilt position height adjusting mechanism, and the like.

Advantageous Effects of Invention

According to the present invention, it is possible to make higher the resolution of a PTEM image, to thereby realize a versatile use thereof.

BRIEF DESCRIPTION OF DRAWINGS

FIG. 2(a) illustrates a real image, FIG. 2(b) illustrates a Fourier transform image, FIG. 2(c) illustrates a phase operation (small diaphragm), FIG. 2(d) illustrates an inverse Fourier transform image of FIG. 2(c), FIG. 2(e) illustrates a phase operation (large diaphragm), and FIG. 2(f) illustrates an inverse Fourier transform image of FIG. 2(e).

FIG. 5(a) illustrates a structure around a phase plate, and FIG. 5(b) illustrates a cross sectional shape of the phase plate (an example).

FIG. 7(a) shows a cross section of the phase plate, and FIG. 7(b) shows the CTF of the phase plate of FIG. 7(a).

FIG. 8(a) shows the proper amount of change in phase, and FIG. 8(b) shows the CTF corresponding to FIG. 8(a).

FIG. 10(a) illustrates amorphous carbon, and FIG. 10(b) illustrates single-crystal Al.

FIG. 12 illustrates an embodiment relating to an irradiation system of a scanning electron microscope, a scanning transmission electron microscope, or the like.

FIG. 14(a) shows the coherence before the adjustment, and FIG. 14(b) shows the coherence after the adjustment.

DESCRIPTION OF EMBODIMENTS

Figure 1:
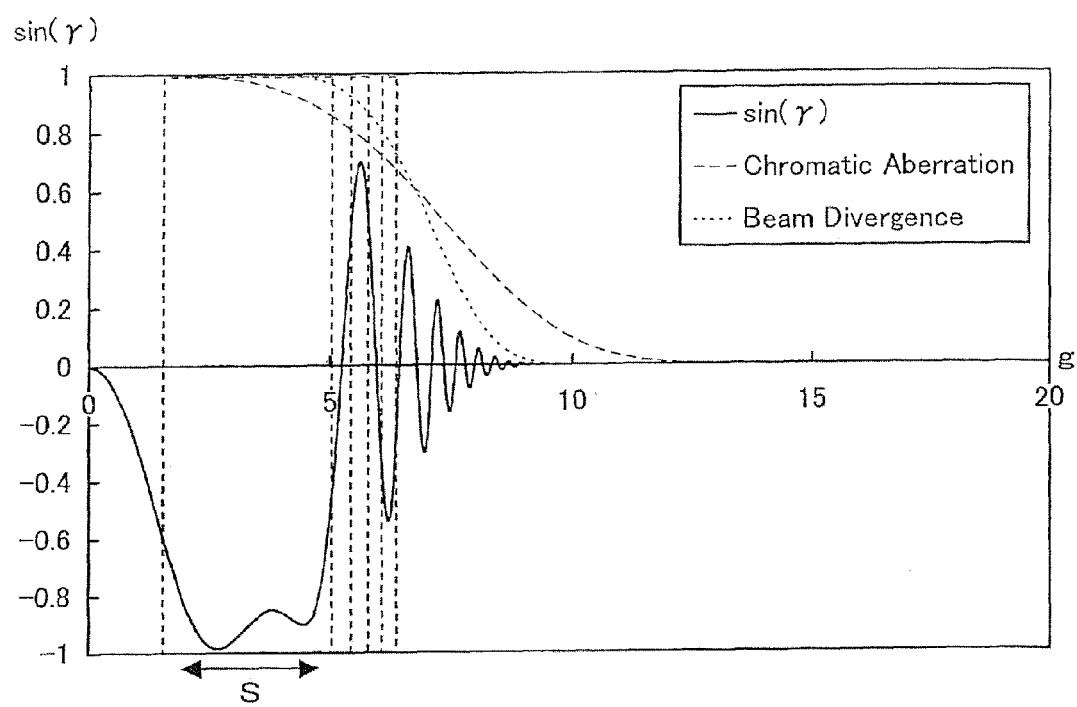
FIG. 1 shows a general phase transmitting function (CTF).
Figure 2:
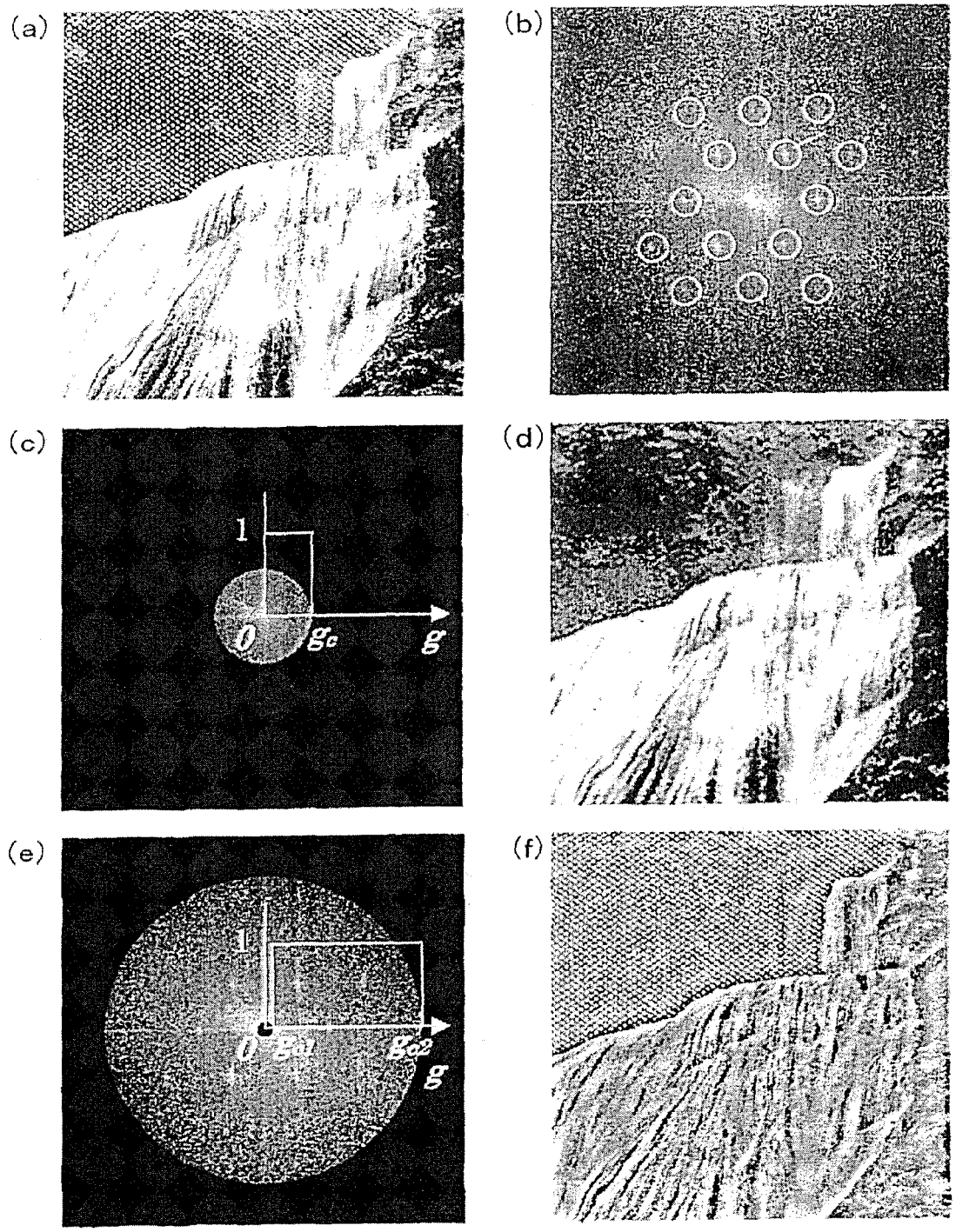
FIG. 2 each illustrate a relation between a phase and a TEM image.
Figure 3:
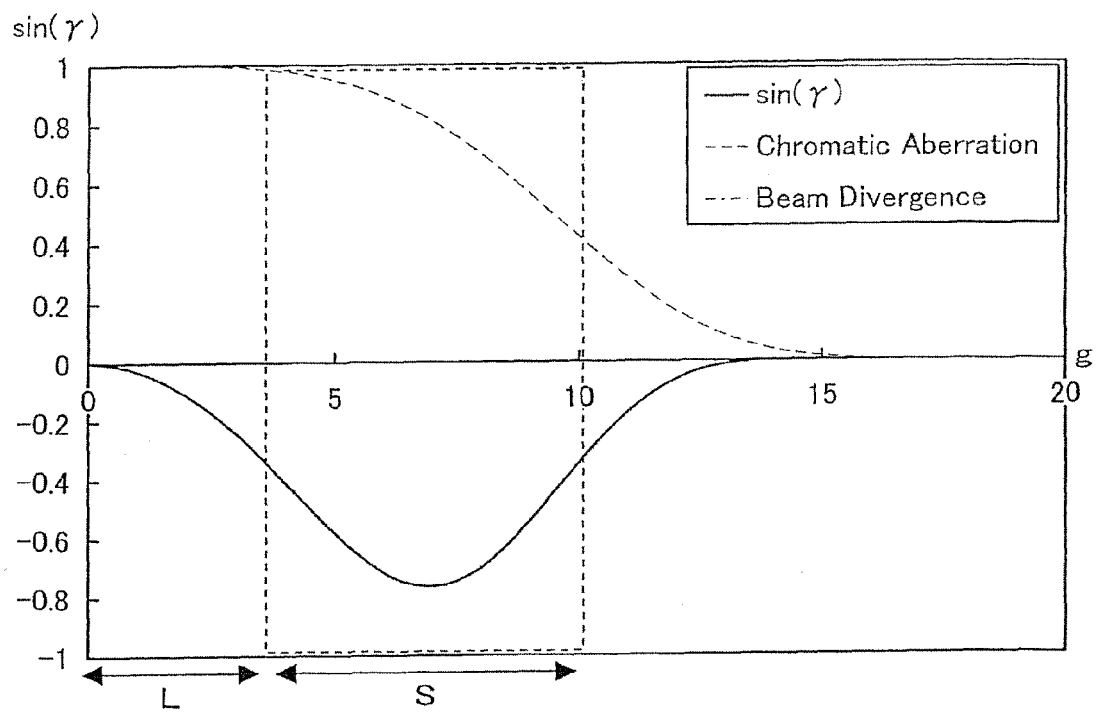
FIG. 3 shows a CTF on which spherical aberration correction has been performed.
Figure 4:
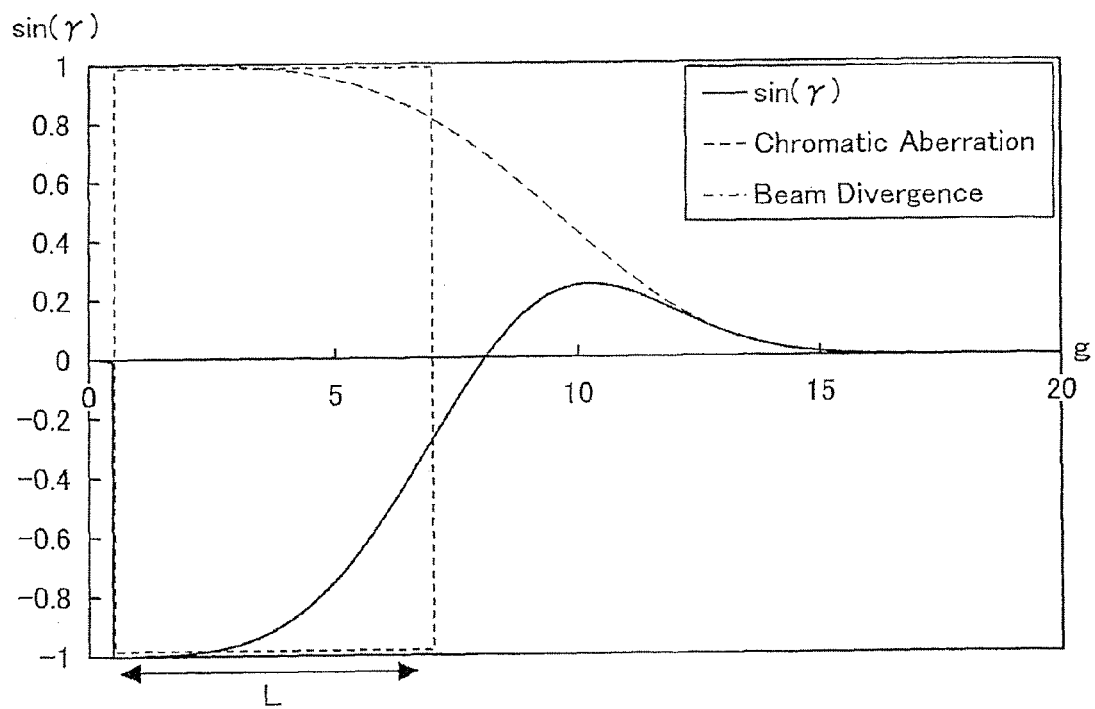
FIG. 4 shows a CTF when the spherical aberration correction has been performed thereon and a phase plate having a uniform thickness is used.
Figure 5:
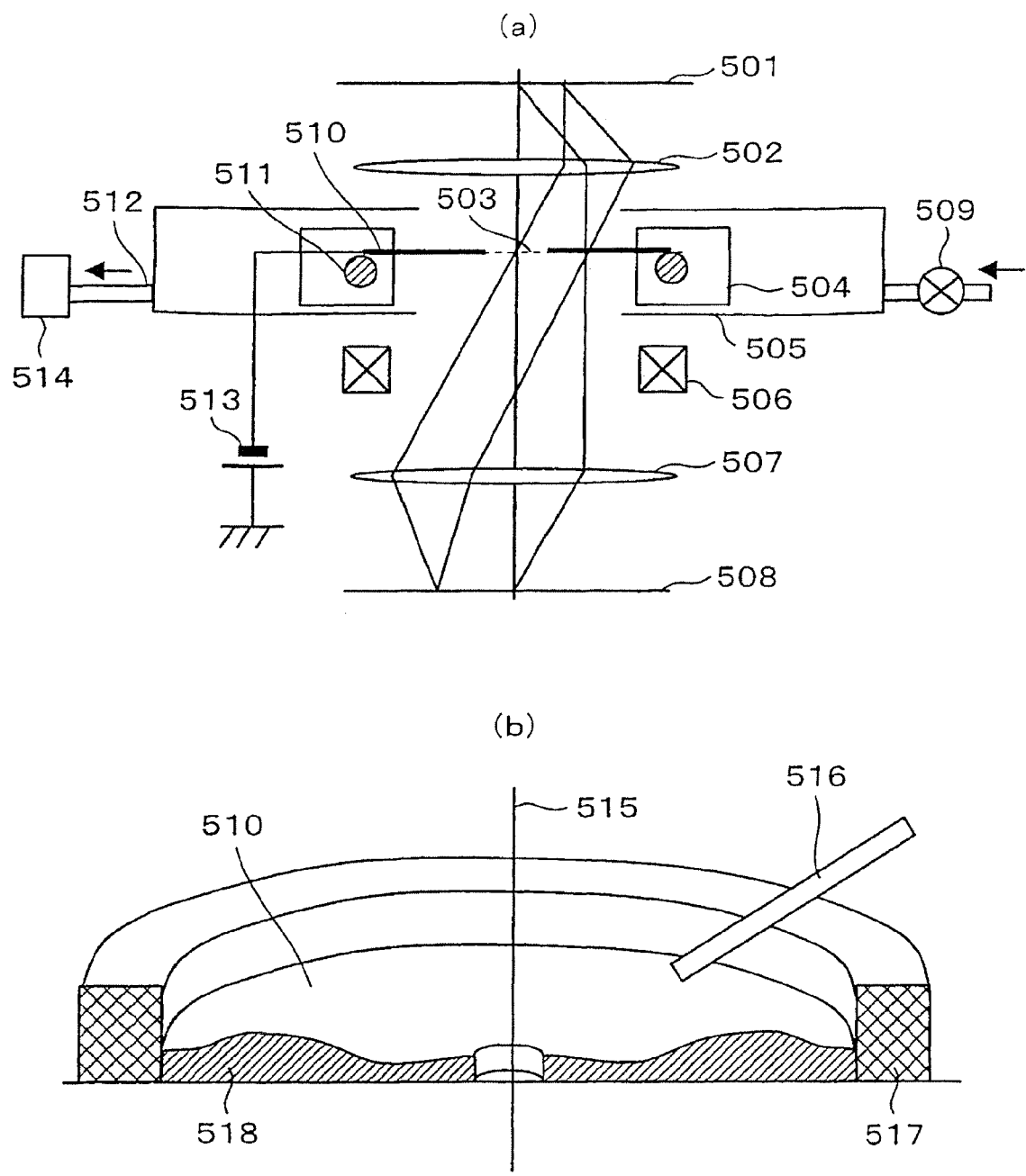
FIG. 5 each are a schematic view of an embodiment.

In the present embodiment, as illustrated in FIG. 5(a), a phase plate 510 is disposed at a back focal plane of an objective lens 502, and a phase plate holder 504 including a mechanism which heats, tilts, and displaces the phase plate 510 and applies a voltage to the phase plate 510 is provided.

The phase plate 510 has a shape as illustrated in FIG. 5(b), and is a circular plate having a small hole. A cross sectional shape thereof has a thickness which changes in the radial direction as needed. In actuality, it is desirable to dispose the phase plates 510 having several shapes, and select the phase plate 510 to be used in accordance with a structure, characteristics, or an observation purpose of an observed sample.

It is desirable to select an appropriate value for the voltage to be applied to the phase plate 510 in accordance with the structure, the characteristics, and the observation purpose of the observed sample.

Similarly to the CTEM, an electron microscope including the phase plate 510 is provided with an objective stigma for performing astigmatism correction of the objective lens 502, and is also provided with a phase plate stigma 506 for performing astigmatism correction of the phase plate 510 which functions as a lens.

In addition, a phase plate chamber 505 is provided for a reduction in charge up due to electron beam irradiation of the phase plate 510, and a mechanism which enables gas introduction is provided therein. The phase plate chamber 505 has a hole having a diameter which is large enough to allow the electron beam to pass therethrough. The degree of vacuum in the phase plate chamber 505 is adjusted in accordance with the balance between an amount of introduced gas and an exhaust velocity.

In addition, potential distribution around the phase plate 510 is changed by gas introduction, and hence sufficient adjustment for use is required, so that a phase plate chamber degree-of-vacuum adjusting function using a PC may be provided.

Figure 6:
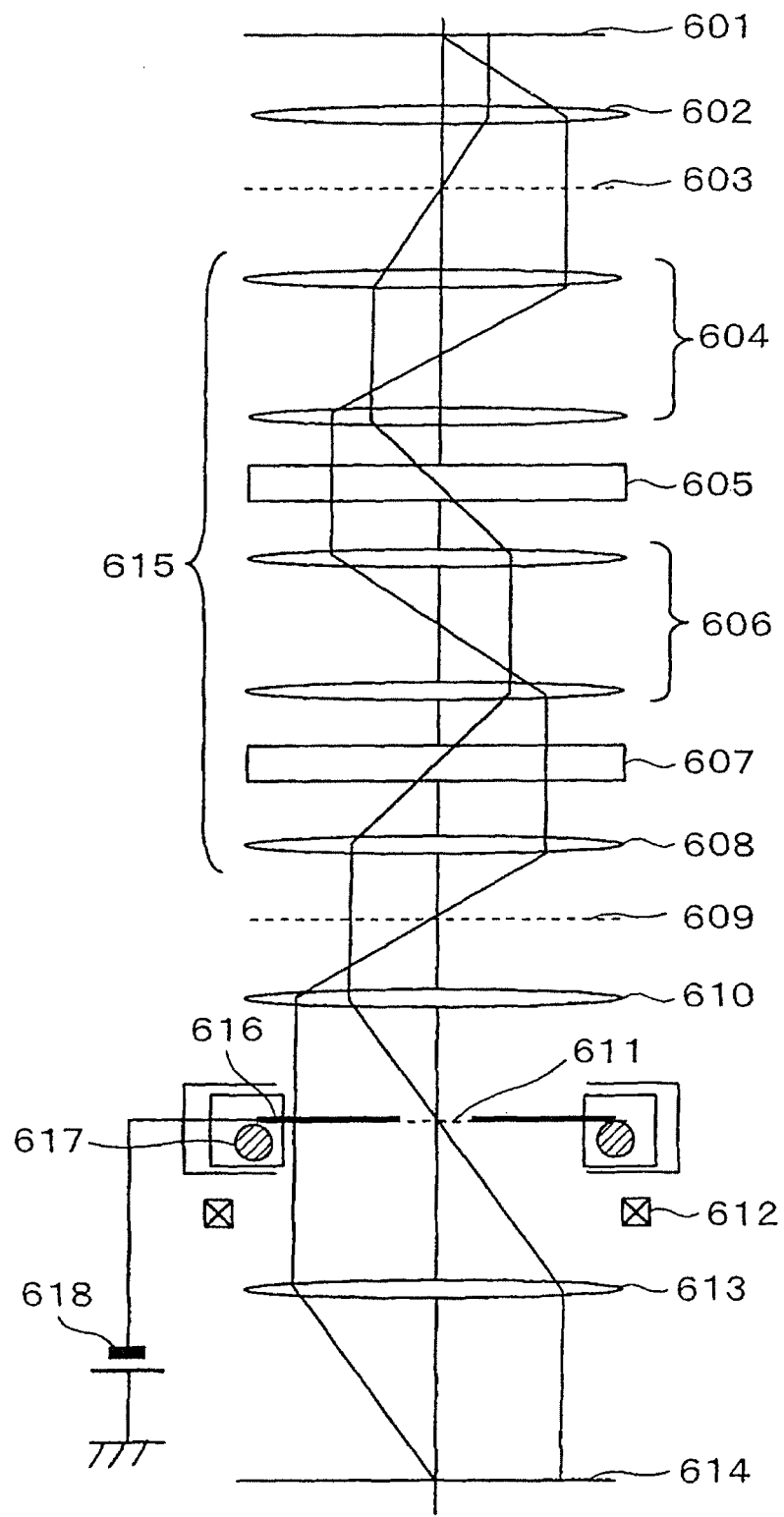
FIG. 6 is a schematic view illustrating a structure in which a spherical aberration correcting function and the phase plate are combined with each other.

FIG. 6 is a schematic view illustrating an optical system in which a spherical aberration correction lens is disposed between the phase plate chamber and the objective lens. This configuration makes it possible to incorporate, as an electron microscope function, the combination of a spherical aberration correcting function and a phase difference adjusting function.

The position adjustment of the phase plate with respect to the electron beam is difficult for a normal operator, and hence it is effective to provide an automatic position adjusting function, for the purpose of facilitating the operation.

According to the present embodiment, it is possible to correct a spherical aberration of an imaging system of the transmission electron microscope. There is an effect of improving the coherence at the time of use for the irradiation system of the scanning electron microscope, to thereby improve the brightness of an electron beam probe. The use for the irradiation system of the transmission electron microscope makes it possible to irradiate a sample with an electron beam having high coherence. Further, in comparison with a spherical aberration corrector which uses a large number of electron lenses, it is possible to provide a similar effect at relatively lower costs. This effect can be used for the imaging system including the objective lens in the transmission electron microscope.

It should be noted that, in the present embodiment, there is disclosed an electron microscope including: means for adjusting a phase difference between a portion on an optical axis and a portion passing outside of the optical axis, of an electron beam passing through the electron microscope; and a phase plate having a thickness which changes in a radial direction.

In addition, in the present embodiment, there is disclosed an electron microscope including: means for adjusting a phase difference between a portion on an optical axis and a portion passing outside of the optical axis, of an electron beam passing through the electron microscope; and a phase plate having a potential which changes in a radial direction.

In addition, in the present embodiment, there is disclosed an electron microscope including: means for adjusting a phase difference between a portion on an optical axis and a portion passing outside of the optical axis, of an electron beam passing through the electron microscope; and a phase plate supporting mechanism having a function of adjusting a potential.

In addition, in the present embodiment, there is disclosed an electron microscope including: means for adjusting a phase difference between a portion on an optical axis and a portion passing outside of the optical axis, of an electron beam passing through the electron microscope; and a mechanism for performing, if a change in phase does not uniformly occur on the same concentric circle, correction of the change in phase.

In addition, in the present embodiment, there is disclosed the electron microscope, in which the phase plate is a conductive crystalline phase plate.

In addition, in the present embodiment, there is disclosed the electron microscope, in which the phase plate is a conductive amorphous phase plate.

In addition, in the present embodiment, there is disclosed the electron microscope further including a phase plate supporting mechanism including: a mechanism for adjusting a tilt, a position, and/or a height of the phase plate; and a mechanism for adjusting temperature.

In addition, in the present embodiment, there is disclosed the electron microscope further including a phase plate chamber, an electron beam passage port, a gas introduction pipe, a gas flow adjustment valve, and an exhaust apparatus, for adjusting a gas pressure in the vicinity of the phase plate.

In addition, in the present embodiment, there is disclosed an electron beam phase adjuster, which is used for the electron microscope.

In addition, in the present embodiment, there is disclosed: a phase difference electron microscope; a transmission electron microscope which is configured by combining the phase difference electron microscope and a spherical aberration corrector; a scanning electron microscope; a scanning transmission electron microscope; or a transmission electron microscope.

In addition, there is disclosed the electron microscope further including a mechanism which is capable of automatically performing axis adjustment of a phase adjusting mechanism.

Hereinafter, the above-mentioned and other novel features and effects of the present invention are described with reference to the drawings. It should be noted that the drawings are employed for the understanding of the invention, and do not restrict the scope of the claims.

Embodiment 1

FIG. 5(a) illustrates a schematic mechanism of the present embodiment. In the present embodiment, description is given of an electron microscope including a phase plate in the vicinity of a diffraction plane of an electron beam. There is provided a function of causing the phase plate holder 504 to heat, tilt, and displace the phase plate 510 and to apply a voltage to the phase plate 510. The phase plate 510 has a mechanism which is inserted from the outside into the phase plate chamber 505 by using the phase plate holder 504. The phase plate chamber 505 has a hole having a diameter which is large enough to allow the electron beam to pass therethrough. In addition, the phase plate chamber 505 includes: a gas introducing mechanism including a gas introduction valve adjusting function 509 and a gas introduction pipe 516; and an exhausting mechanism including an exhaust pipe 512 and an exhaust apparatus 514.

The phase plate 510 has a shape as illustrated in FIG. 5(b), and is a circular plate having a small hole. A cross sectional shape of the phase plate has a thickness which changes in the radial direction as needed. Hereinafter, description is given of an example of an effect obtained by changing the thickness in the radial direction.

Figure 7:
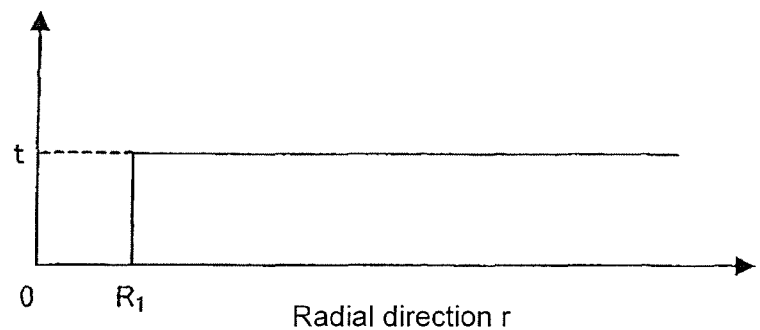
FIG. 7 each show a relation between the phase plate and the CTF (an example).
Figure 7:
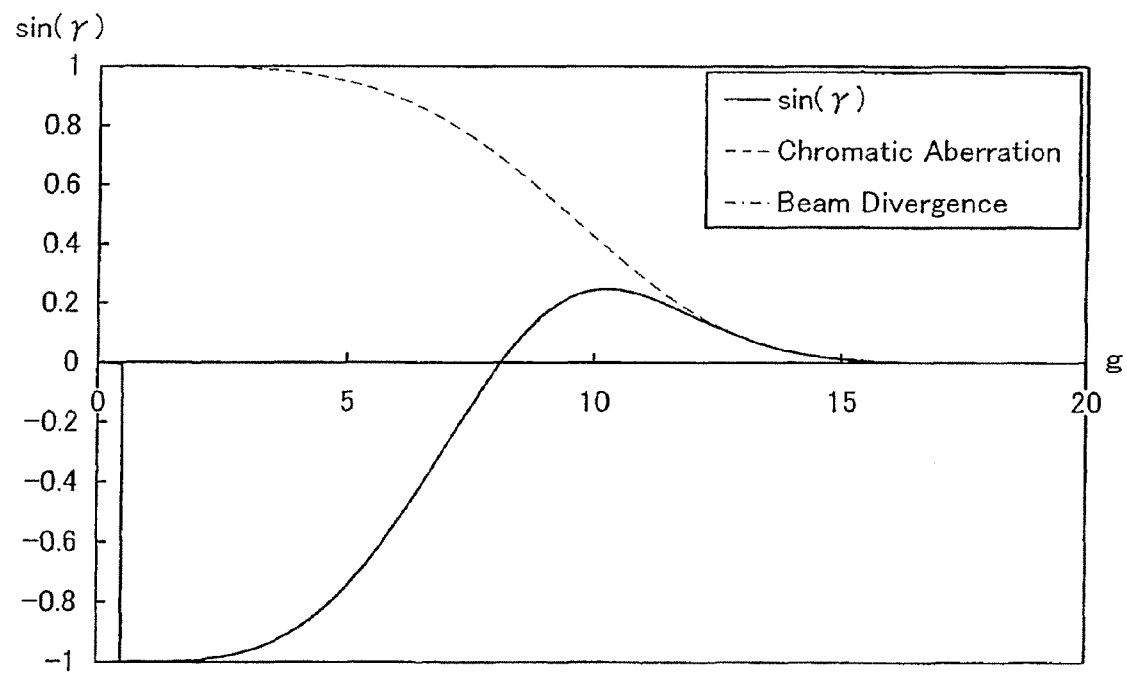

FIG. 7 shows a cross sectional shape of only one side of the phase plate having a thickness which does not change in the radial direction, from the center toward the outer side. A hole is opened at the center, and the thickness thereof is 0. An outer portion from a radius $R_1$ has a uniform thickness of t. In addition, it is assumed that the thickness of t is a thickness which changes a phase of the electron beam by exactly $\pi/2$ by using the phase plate. t is decided by a material used for the phase plate and the accelerating voltage of the electron beam.

In the case where this phase plate is used in a TEM in which the accelerating voltage is 300 kV, the defocus is 4.5 nm, the spherical aberration is 0.005 mm, the deviation from the in-focus position due to the chromatic aberration is 3 nm, and the beam divergence is 0.3 mrad, the CTF is as shown in FIG. 7(b). From this figure, it is understood that a nano-sized or larger structure can be observed with an excellent contrast, but $\sin(\gamma)$ exhibits 0 near g=7.8. In this condition, part of information is lost, and hence it is not possible to obtain all information that the sample originally has.

In the TEM in which the accelerating voltage is 300 kV, the defocus is 4.5 nm, the spherical aberration is 0.005 mm, the deviation from the in-focus position due to the chromatic aberration is 3 nm, and the beam divergence is 0.3 mrad, characteristics of proper change in phase using a phase plate for forming an image of the largest amount of information are shown in FIG. 8(a). The horizontal axis thereof is g which is a value obtained by dividing a radius r of the phase plate by a camera length L. The vertical axis thereof shows a proper amount by which the phase of the electron beam should be changed by the phase plate at the position of each radius. The amount of change in phase is set to $2\pi$-$\pi/2$ near the center, and the reason for this will be described later.

Assuming that the camera length is L (nm·mm), the radius r on the phase plate is associated with a reciprocal lattice vector g as shown below in Expression (9).

$$g=r/L \qquad (9)$$

Assuming that the amount of change in phase of the TEM when the TEM does not use the phase plate is $\gamma 0(g)$, the proper amount of change in phase referred to here can be expressed as follows.

$$\text{Proper amount of change in phase } Ps=2\pi n\pm\pi/2-\gamma 0(g) \qquad (10)$$

where n is an arbitrary integer. As a result of this phase correction, $\sin(\gamma)$ constantly exhibits −1 or 1, and description thereof is given below. In the calculation of the CTF, in actuality, $\pi/2$ which is a change in phase of electrons scattered by the sample is taken into consideration, and $\cos(\lambda/2-\gamma 0(g))$ is calculated, with the result that $\sin(\gamma)$ is derived. When the effect Ps of the phase plate is additionally applied, the following expression is obtained.

$$\cos(-Ps+\pi/2-\gamma 0(g)) \text{ or } \sin(Ps+\gamma 0(g)) \quad (11)$$

As a result, the following expression is obtained.

$$\cos(-2\pi n\pm\pi/2+\gamma 0(g)+\pi/2-\gamma 0(g))=\cos(-2\pi n+\pi/2\pm\pi/2)=\pm 1 \text{ Const.} \quad (12a)$$

or $$\sin(2\pi n\pm\pi/2-\gamma 0(g)+\gamma 0(g))=\sin(2\pi n\pm\pi/2)=\pm 1 \text{ Const.} \quad (12b)$$

Here, $\gamma 0(g)$ is shown below in Expression (13).

$$\gamma 0(g)=\pi Cs\lambda^3 g^4/2-\pi\lambda\Delta f g^2 \quad (13)$$

where Cs is the spherical aberration, $\lambda$ is the wavelength of the electron beam, and $\Delta f$ is the defocus. The usage conditions of the electron microscope are given to Expression (13), whereby the proper amount of change in phase is decided.

FIG. 8(b) shows an ideal CTF with the phase being properly corrected. In this state, all images of from a large structure to a small structure can be formed.

It is one of means for bringing the CTF into an ideal state to change the thickness of the phase plate in the radial direction. $\gamma 0(g)$ variously changes depending on the usage state of the TEM, and hence an ideal shape of the phase plate is also varied. However, in a rough classification, there are four types: a type which becomes thicker gradually from the center toward the outer side; a type which once becomes thicker midway from the center toward the outer side and then becomes thinner; a type which once becomes thinner midway from the center toward the outer side and then becomes thicker; and a type which becomes thinner gradually from the center toward the outer side.

An amount P(r) of change in phase of the electron beam by using the phase plate is shown below in Expression (14) by an inherent potential $\phi$ decided by the material of the phase plate, a thickness T(r) of the phase plate, and a potential V(r) of the phase plate.

$$P(r)=[2\pi e(E_0+E)/\lambda E(2E_0+E)]\{\phi+V(r)\}T(r) \quad (14)$$

where $E_0$ is rest energy of electrons and E is energy of entering electrons.

When the thickness of the phase plate is changed in the radial direction, according to Expression (14), it is possible to change the amount of change in phase of the electron beam in the radial direction by using the phase plate. This effect is achieved by: an effect obtained by the change in thickness of the phase plate itself; and an effect obtained by the change in charging characteristics of the phase plate due to the change in thickness in the radial direction.

Figure 8:
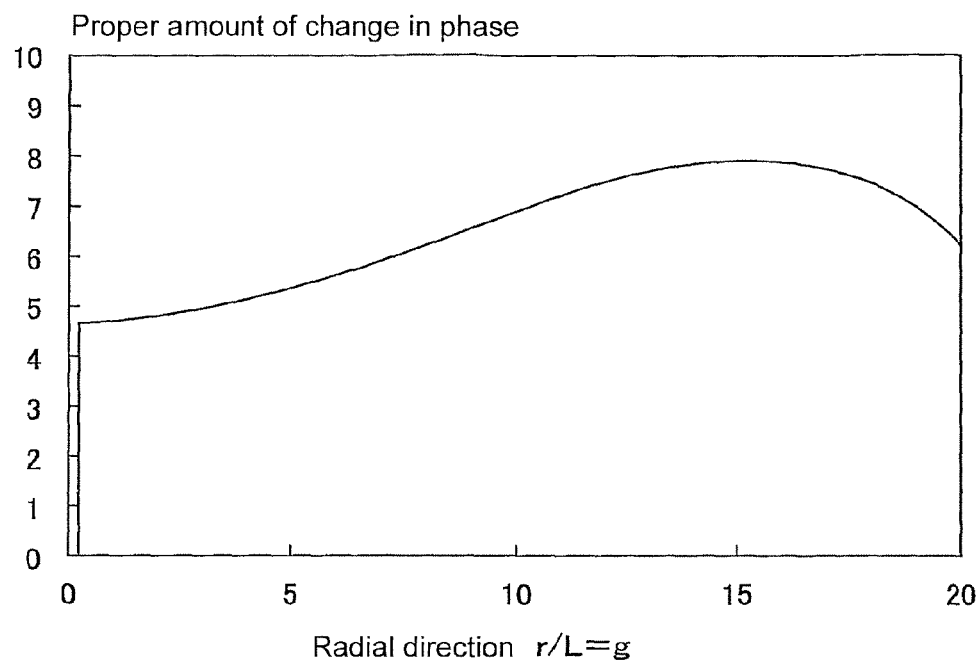
FIG. 8 show a proper amount of change in phase and a final CTF in the case of a PTEM.
Figure 8:
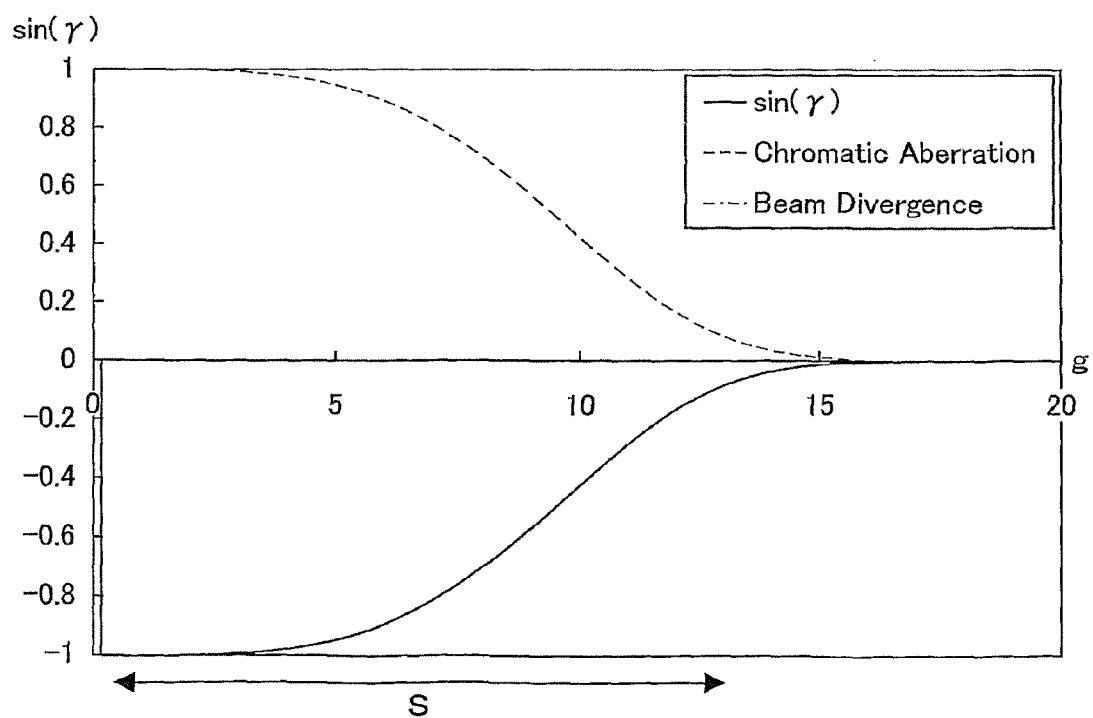
Figure 9:
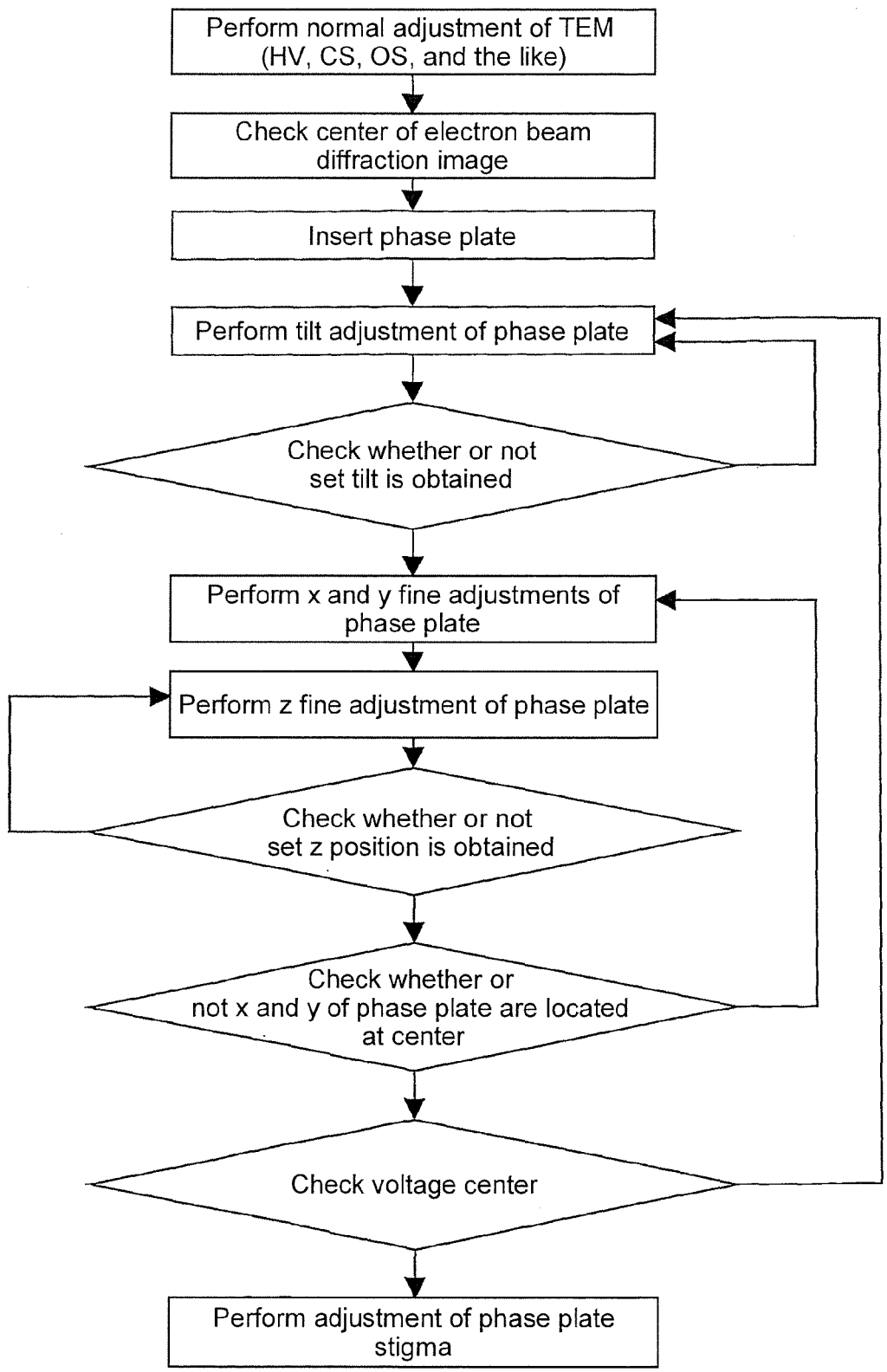
FIG. 9 is a flowchart showing an operation procedure which is performed when switching is made from a TEM mode to a PTEM mode.

Because the thickness of the phase plate cannot be made zero, in order to obtain ideal distribution of the change in phase, it is effective to perform such adjustment that a phase difference of $(2n\pm\frac{1}{2})\pi$ is given in the vicinity of the transmission wave. However, if n is set to a large value, the transmittance of the electron beam itself becomes lower to reduce the contrast of an image, and hence n cannot be set to an excessively large value. From that point of view, the proper amount of change in phase shown in FIG. 8 is set to $(2-\frac{1}{2})\pi$.

In general, a thin film material is positively charged by electron beam irradiation, and a larger amount of irradiation with the electron beam leads to stronger charging. An electron beam diffraction image exhibits distribution of various electron beam intensities in the radial direction, and hence it is necessary to change the shape of the phase plate in accordance with the electron beam diffraction image of the observation sample.

However, a pattern of the electron beam diffraction image is different depending on the sample, and is varied only by the change in observation field of view. Accordingly, the charging by the irradiation of the phase plate with the electron beam is the most significant factor which complicates the operability of the PTEM.

In order to solve this problem, in the present embodiment, there is provided a mechanism capable of applying an arbitrary potential to the phase plate. The charging of the phase plate occurs to the highest degree on an edge of the small hole at the center of the phase plate, which is located in the vicinity of the transmission wave of the electron beam diffraction image. This is because a large background exists in the vicinity of the transmission wave of the electron beam diffraction image.

Here, it is assumed that the central part of the phase plate is charged to 7 V by the electron beam irradiation. In that case, the entire phase plate is charged to 7 V or higher, whereby the charged potential becomes constant in the radial direction of the phase plate. In this state, it is possible to substantially control the amount of change in phase of the electron beam in the radial direction of the phase plate by means of the thickness of the phase plate.

In addition, a potential applied to the phase plate is changed to the charged potential near the center of the phase plate, whereby the potential in the radial direction can be changed arbitrarily. This mechanism is advantageous when there is a slight difference between the shape of the phase plate in use and an ideal shape of the phase plate which is required by the conditions of the electron microscope currently used for the observation. Effects which act on the change in phase of the electron beam at this time are a thickness effect and a potential effect of the phase plate.

Another measure for controlling the charging can be conceived. The above-mentioned method is a control method using the mechanism which holds a charged state, and alternatively, there is also a method of controlling the charging by using a gas species. For this purpose, in the present embodiment, a gas introduction port and an exhaust port are provided. In the case where charging occurs due to an influence of the electron beam, the charging is balanced by the exchange between a gas species and electrons.

As a gas pressure is higher, an effect of suppressing the charging is higher. However, the gas pressure cannot be made worse than the degree of vacuum required by an electron gun of an electron beam microscope, and hence there is a restriction. The gas pressure is decided by the relation between the size of an electron beam introduction port, the flow rate of an introduced gas, and the exhaust velocity. It is possible to face a leading end of a gas pipe toward the vicinity of the center of the phase plate which is charged to the highest degree so that the introduced gas can effectively suppress the charging. An example thereof is illustrated in FIG. 5(b).

The CTF of the PTEM is evidently decided by the phase difference between the transmission wave and the diffraction wave. A method of adjusting the phase of the diffraction wave to the best condition by means of the thickness or the potential of the phase plate is one of the points of the present embodiment.

Figure 11:
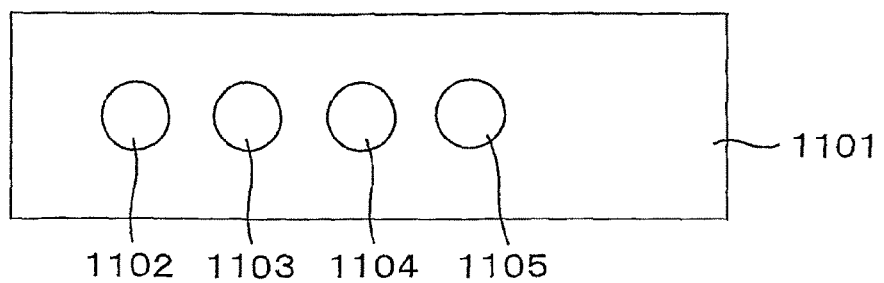
FIG. 11 illustrates phase plates and a phase supporting electrode.

An ideal shape of the phase plate is changed by the accelerating voltage at the time of photographing by the electron microscope, the defocus, the spherical aberration, the deviation from the in-focus position due to the chromatic aberration, and the beam divergence. Therefore, it is desirable to provide a mechanism in which several phase plates corresponding to conditions which are more likely to be used for observation can be selected. For example, as illustrated in FIG. 11, a phase plate A 1102, a phase plate B 1103, a phase plate C 1104, and a phase plate D 1105 are provided in a thick phase plate supporting electrode 1101.

When the phase plate is charged, the phase plate has a function as an electrostatic lens. It may be considered that there is not a large influence when the charged potential is still small, but in the case of using the phase plate whose hole at the center of the phase plate is small, the axis adjustment of the phase plate affects the image quality.

For the axis displacement of the phase plate, there are x, y, and z as well as Tilt and Azim. A method of correcting a position and a tilt of the phase plate is described below. First, the axis adjustment and various types of astigmatism correction are performed on the electron microscope without the insertion of the phase plate.

After the adjustment of the electron microscope has been finished, the electron beam diffraction image is checked, to thereby check at which part of a CCD camera the center of the diffraction image appears. In order to prevent the CCD camera from being broken by strong electron beam irradiation, a filter is used for preventing burnout.

The phase plate is inserted, and the transmission wave of the electron beam diffraction image is caused to reach the phase plate. An imaging lens is adjusted, and the electron beam diffraction image of the phase plate, which is formed by the electrons radiated to the phase plate, is brought into an observable state. If the phase plate is made of a single-crystal material, the tilt of the phase plate with respect to the electron beam can be accurately determined by observing a diffraction pattern of the phase plate using the CCD camera.

Both of Tilt and Azim are adjusted, and the tilt adjustment is continued with feedback until the designed tilt and the actual tilt of the phase plate coincide with each other.

Next, x and y fine adjustments are moved so that the hole of the phase plate is positioned at the center of the electron beam diffraction image.

The image formed by the PTEM is checked, and a z position of the phase plate is examined. Specifically, when an image is shown at low magnification, if the z position of the phase plate is largely different from the image plane of the electron beam diffraction image, a region in which a phase difference image appears becomes smaller.

In relation to the positional relation between the height z of the phase plate and the image plane of the electron beam diffraction image, when the phase plate is moved farther from the image plane of the electron beam diffraction image, it is possible to give the contrast to a larger structure. However, the observation field of view becomes narrower, and blurring occurs on the periphery of the image. On the other hand, when the phase plate is positioned exactly at the image plane of the electron beam diffraction image, the observation field of view becomes largest, and blurring on the periphery can be reduced. However, the size of a structure to which the contrast can be given is a designed value of the phase plate. It is desirable to make selective use depending on the intended purpose.

The position of the phase plate is correlated with the size of the phase difference image region observed by the PTEM, and hence the z position of the phase plate can be roughly adjusted by monitoring the size of the phase difference image region. At this time, because there may be a move in x or y, the x or y position adjustment is performed again.

Lastly, the voltage center of the entire PTEM is checked, and if the voltage center is deviated more than an allowable value, the position adjustment of the phase plate from the tilt correction is performed.

After the position adjustment of the phase plate has been finished, the adjustment of the phase plate stigma occurring in the phase plate is performed. The position and tilt adjustments of the phase plate require time and effort, and hence it is desirable to provide a mechanism capable of automatic processing therefor.

In order to check whether or not the phase plate functions in an ideal state, an average amorphous sample is found in the vicinity of the observation sample, and an image obtained by photographing the found region by the CCD camera is subjected to the Fourier transform.

In general, the Fourier transform image of the TEM image is used for examining characteristics of the CTF. It is equally effective to attach a sample for PTEM adjustment in advance in the vicinity of the observation sample.

If the phase plate does not function properly, it is necessary to take a measure thereagainst. For example, the used phase plate is changed, or the applied voltage is changed. In the case where the phase plate is used together with the spherical aberration correcting apparatus, it is equally effective to change the spherical aberration. As a matter of course, changing the focus is one of the measures which can be conceived naturally.

It is checked whether or not the contrast can be obtained at a magnification to be set for observation, whereby a precious sample can be observed with little damage within a short time.

If the irradiation of the phase plate with the electron beam causes contamination on the phase plate, the thickness of the phase plate is partially changed, so that the function which is originally designed as the phase plate is lost. In order to reduce such contamination, the observation is performed while heating the phase plate, and the serviceable time of the phase plate can be further extended by providing a cold trap in the phase plate chamber.

Metal having good conductive properties is the most suitable for a material of the phase plate. In addition, because the phase plate is irradiated with the strong electron beam while being heated, a heat-resistant material is preferable. It is desirable that a crystalline structure of the phase plate be uniform, and it is desirable that the crystalline structure thereof be single-crystal or amorphous. In the case of an amorphous material, the scattering wave is generated in the vicinity of the electron beam which has been transmitted through the phase plate, and hence a certain amount of noise of the electron beam scattered by the phase plate mixes into the field of view of the phase difference image. As a result, a random pattern peculiar to the amorphous material is superimposed on the phase difference image. However, the amorphous phase plate is easily manufactured, and thus is effective for a sample having a large structure.

Figure 10:
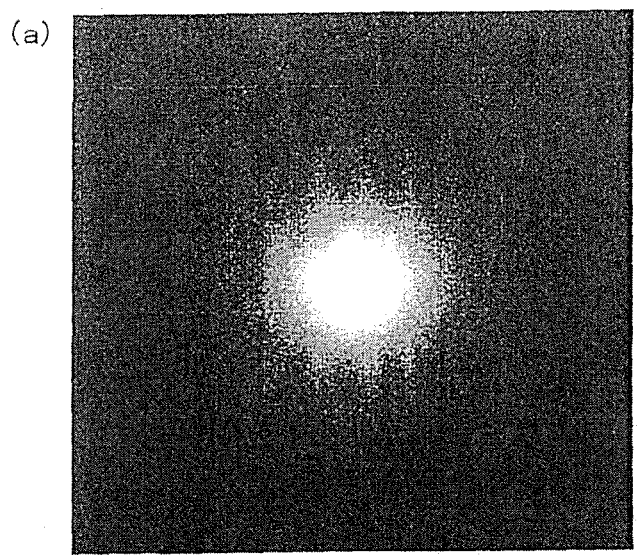
FIG. 10 illustrate a comparison between electron beam scatterings by using respective phase plates.
Figure 10:
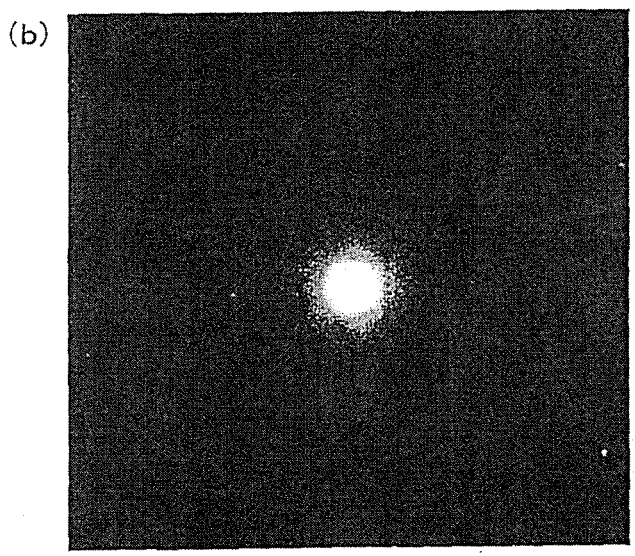

In the present embodiment, the used phase plate is made of a single-crystal material and is designed so as to make higher-order diffraction of the electron beam. In the case of the single-crystal phase plate, noise in the vicinity of the transmission wave is reduced. Accordingly, noise components of the phase difference image can be reduced. In addition, in the case of the single-crystal phase plate, noise appears in a regular stripe pattern deriving from a lattice image, and hence it is possible to easily remove the noise by the IFFT (inverse Fourier transform). For reference, a scattering pattern of the amorphous phase plate and a scattering pattern of a single-crystal higher excitation phase plate are illustrated in FIGS. 10(a) and 10(b), respectively.

When the position and tilt adjustments of the phase plate and the adjustment of the phase plate stigma are completed and it can be confirmed that the phase plate normally functions, the adjustment of the PTEM comes to an end. It is possible to search the observation field of view and acquire the data similarly to the TEM.

Embodiment 2

Figure 12:
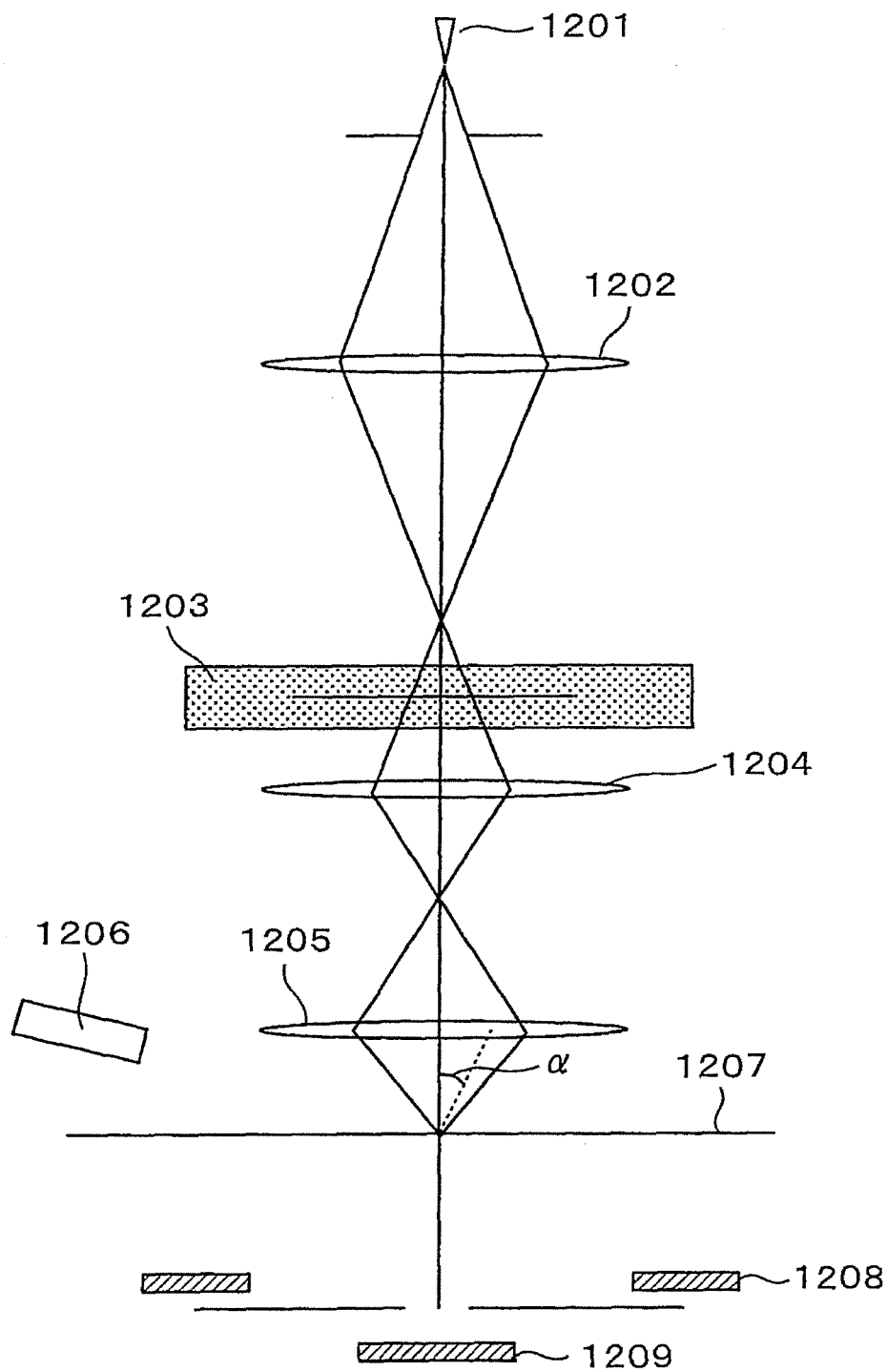

Embodiment 2 is illustrated in FIG. 12. In the present embodiment, there is disclosed a scanning electron microscope which converges an electron beam on a sample surface for observation, the scanning electron microscope including a phase adjusting apparatus which adjusts a phase difference on the sample surface between electrons having different irradiation angles, which is caused by a spherical aberration of a lens provided between a sample and an electron source.

According to the present embodiment, it is possible to improve the coherence when a large diaphragm is used and the irradiation angle is made larger, so that the brightness of an electron probe is improved. As a result, high-sensitivity analysis and photographing of an image with a high S/N ratio are possible.

The use as a scanning transmission electron microscope, which is configured by providing the above-mentioned scanning electron microscope with a transmitted electron detector and a scattered electron detector, is also possible.

In the case of the use as the scanning electron microscope or the scanning transmission electron microscope, the proper amount of change in phase is different from that of Embodiment 1. In the case of the use as the scanning microscope, a phase difference $\gamma(\alpha)$ of an electron beam reaching the sample for each irradiation angle $\alpha$ is shown below in Expression (15).

$$\gamma(\alpha) = \pi C s \alpha^4 / 2\lambda - \pi \Delta f \alpha^2 / \lambda \quad (15)$$

Figure 13:
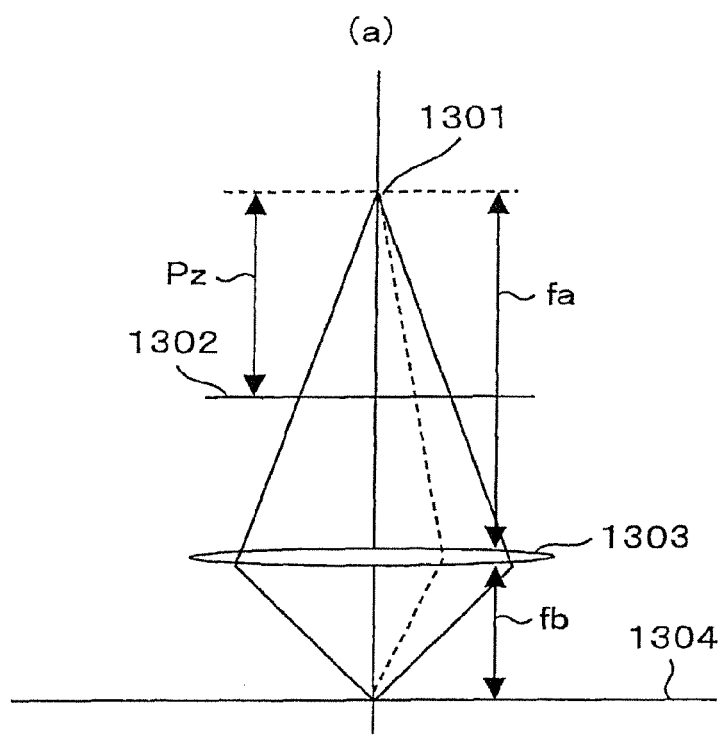
FIG. 13 illustrate an example of a positional relation between a phase plate, the irradiation system, and a sample and a proper amount of change in phase.
Figure 13:
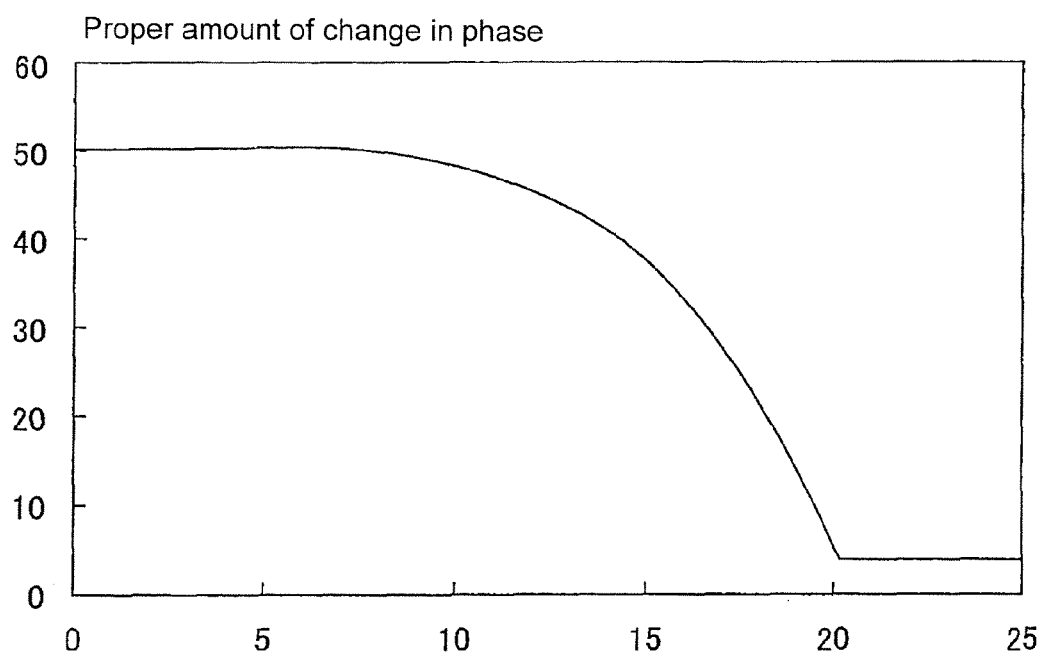

At this time, it is not necessary to consider the change in phase $\pi/2$ due to sample scattering in the phase modulation of the irradiation system, and hence the proper amount of change in phase is shown below in Expression (16).

$$\text{Proper amount of change in phase} = 2\pi n - \gamma(\alpha) \quad (16)$$

where n is an integer. For example, in the electron microscope with the accelerating voltage of 200 kV, when the defocus is 10 nm and the spherical aberration is 0.5 mm, the proper amount of change in phase is as shown in FIG. 13(b). In FIG. 13(b), the horizontal axis thereof is $\alpha$, and a distance R in the radial direction of the phase plate and $\alpha$ are associated with each other as follows, on the basis of the positional relation between a virtual light source, the phase plate, the objective lens, and the sample.

$$R = \tan(\alpha)(fb/fa)Pz \quad (17)$$

The above expression is established on the assumption of the simplest irradiation system. In actuality, there is an electron microscope in which several converging lenses are used, and hence the association between R and a cannot be shown as simple as Expression (17), but is an extension of Expression (17) basically. In any system, the distance R in the radial direction of the phase plate and the irradiation angle $\alpha$ can be associated with each other.

In the case of applying the present embodiment to the irradiation system, a phase adjusting mechanism may be disposed at any position between the electron beam source and the sample. However, in the scanning microscope, the optical axis of the electron beam is displaced at the time of scanning with the electron beam, and hence it is desirable that the phase adjusting mechanism be disposed on the electron beam source side with respect to a scanning coil.

Figure 14:
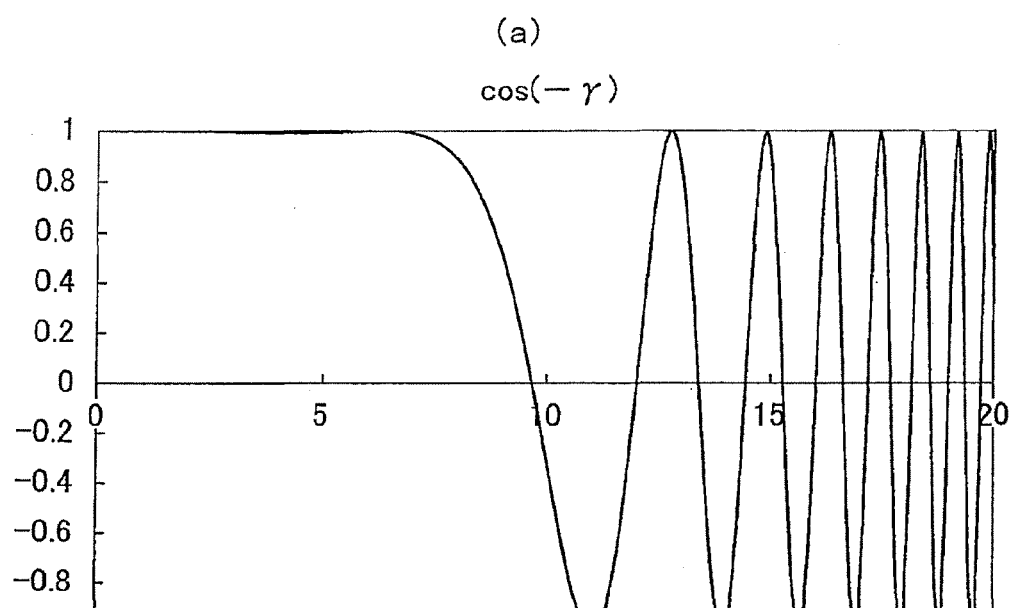
FIG. 14 show electron beam coherences before and after phase adjustment.
Figure 14:
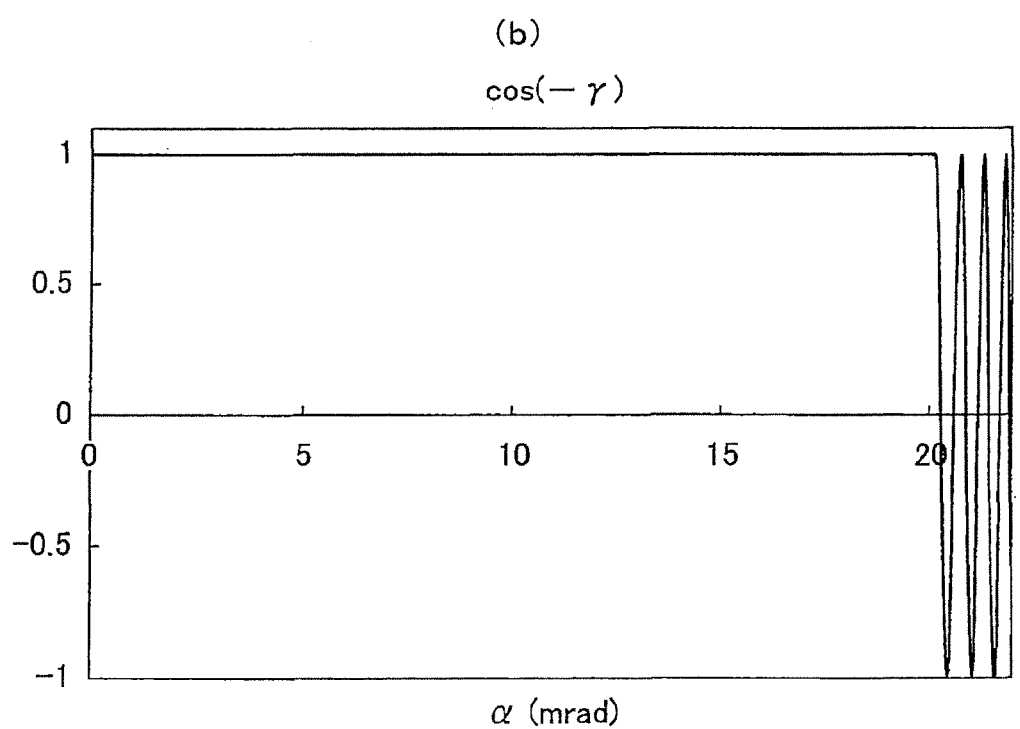

In a normal STEM, it is sufficient if the coherence can be secured within a range of approximately 10 mrad, and it is found out that, according to the present embodiment, the coherence can be secured satisfactorily up to approximately 20 mrad. Because the thickness of the phase plate cannot be made zero, there is a limit to an application range. In the present embodiment, the phase plate having a thickness which is constant at 20 mrad or larger is adopted. FIGS. 14(a) and 14(b) show the coherences before and after the phase adjustment by means of $\cos(-\gamma)$, respectively.

A hole is not opened at the center of the phase plate, and this is a feature of Embodiment 2. The four patterns can be conceived as the patterns of the shape as described in Embodiment 1.

Figure 15:
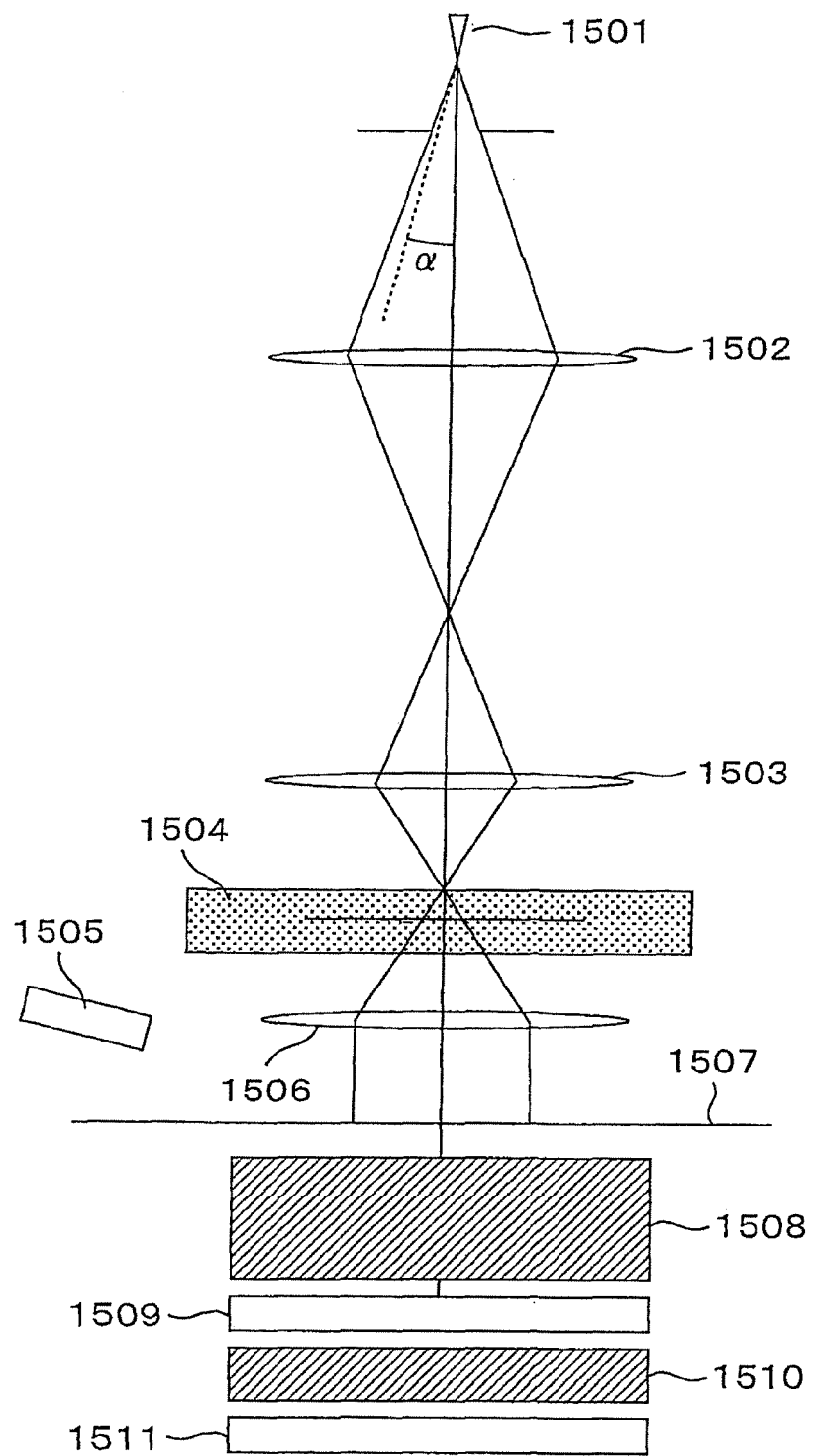
FIG. 15 illustrates an embodiment which is combined with the irradiation system of the transmission electron microscope.

As illustrated in FIG. 15, in the scanning transmission electron microscope, the transmitted electron detector is replaced with an imaging lens 1508, and an image photographing apparatus is combined, whereby the transmission electron microscope including the phase adjusting mechanism can be configured. It becomes possible to uniformly adjust, on the sample surface, a phase shift of irradiation electrons which occurs in the irradiation system. For example, in the case, such as in electron beam holography, where information on a change in phase is recorded and evaluated, an electron beam with a uniform phase is required in a wide range, and hence the present invention is particularly effective.

INDUSTRIAL APPLICABILITY

In recent years, a technology of observing an organic material such as a cell organelle, protein, and a high molecule without staining the material by using a TEM has attracted attention. At present, although only limited researchers have started pioneering studies on the PTEM, if the PTEM is widely used in the world as a general-purpose apparatus to be utilized by various research institutes, the progress of research results in the cell science and the medical science can be expected almost as a matter of course.

When the present invention is applied to the irradiation system of the scanning electron microscope or the scanning transmission electron microscope, it is possible to form an electron beam probe having high coherence, which enables high-sensitivity analysis and high-resolution observation.

When the present invention is applied to the irradiation system of the transmission electron microscope, it is possible to irradiate a sample with an electron beam having high coherence, and this is effective in the case, such as in holography, where analysis is performed using the interference between electron beams.

REFERENCE SIGNS LIST

501, 601 object surface
502, 602, 1205, 1303, 1506 objective lens
503, 603 diffraction plane
504 phase plate holder
505 phase plate chamber
506, 612 phase plate stigma
507 imaging lens
508 image plane
509 gas introduction valve adjusting function 510 phase plate
511 heater
512 exhaust pipe
513 voltage applying means
514 exhaust apparatus
515 optical axis
516 gas introduction pipe
517 electrode for voltage application
518 cross section of phase plate
604 transfer dublet 1
605 hexapole 1
606 transfer dublet 2
607 hexapole 2
608 ADL
609 image plane
610 intermediate lens
611 diffraction plane 2
613 imaging lens
614 image plane
615 spherical aberration correction lens
616 phase plate
617 heater
618 voltage applying means
1101 phase plate supporting electrode
1102 phase plate A
1103 phase plate B
1104 phase plate C
1105 phase plate D
1201, 1501 electron beam source
1202, 1502 converging lens 1
1203, 1504 phase difference adjuster
1204, 1503 converging lens 2
1206, 1505 secondary electron detector
1207, 1304, 1507 object surface (sample)
1208 scattered electron detector
1209 transmitted electron detector
1301 virtual light source
1302 phase plate
1508 imaging lens
1509 phase change analyzing apparatus
1510 image storing mechanism
1511 electron energy loss analyzing apparatus

The invention claimed is:

1. An electron microscope, comprising:
   an electron gun;
   an objective lens configured to focus an electron beam emitted from the electron gun on a sample;
   a spherical aberration corrector configured to correct a spherical aberration of the objective lens; and
   a phase plate configured to have a thickness which continuously changes in a radial direction,
   wherein a phase difference due to a difference in electron beam path of the electron beam passing through the objective lens is eliminated by the phase plate.

2. The electron microscope according to claim 1, further comprising a mechanism which is capable of automatically performing axis adjustment of a phase adjusting mechanism.

3. The electron microscope according to claim 1 wherein the phase plate is a conductive crystalline phase plate.

4. The electron microscope according to claim 1, wherein the phase plate is a conductive amorphous phase plate.

5. The electron microscope according to claim 1, further comprising a phase plate supporting mechanism including:
   a mechanism for adjusting a tilt, a position, and/or a height of the phase plate; and
   a mechanism for adjusting temperature.

6. The electron microscope according to claim 1, further comprising—
   a phase plate chamber,
   an electron beam passage port,
   a gas introduction pipe,
   a gas flow adjustment valve, and
   an exhaust apparatus, for adjusting a gas species pressure in the vicinity of the phase plate.

7. An electron beam phase adjuster, which is used for the electron microscope according to claim 1.

8. The electron microscope according to claim 1, wherein the electron microscope is any one of: a phase difference electron microscope; a transmission electron microscope which is configured by combining the phase difference electron microscope and a spherical aberration corrector; a scanning electron microscope; a scanning transmission electron microscope; and a transmission electron microscope.

9. The electron microscope according to claim 1, wherein the phase plate has a potential which changes in a radial direction.

10. The electron microscope according to claim 1, further comprising:
    a phase plate supporting mechanism configured to have a function of adjusting a potential.

11. The electron microscope according to claim 1, further comprising:
    a mechanism for performing, if a change in phase does not uniformly occur on the same concentric circle, correction of the change in phase.

* * * * *